(12) United States Patent
Takemoto

(10) Patent No.: US 11,025,182 B2
(45) Date of Patent: Jun. 1, 2021

(54) SIGNAL PROCESSING APPARATUS, MOTOR, AND FAN MOTOR

(71) Applicant: Nidec Corporation, Kyoto (JP)

(72) Inventor: Hideyuki Takemoto, Kyoto (JP)

(73) Assignee: NIDEC CORPORATION, Kyoto (JP)

( * ) Notice: Subject to any disclaimer, the term of this patent is extended or adjusted under 35 U.S.C. 154(b) by 32 days.

(21) Appl. No.: 16/669,651

(22) Filed: Oct. 31, 2019

(65) Prior Publication Data

US 2020/0169199 A1 May 28, 2020

(30) Foreign Application Priority Data

Nov. 27, 2018 (JP) .............................. JP2018-221078

(51) Int. Cl.
*H02P 7/29* (2016.01)
*H02P 6/08* (2016.01)

(52) U.S. Cl.
CPC . *H02P 7/29* (2013.01); *H02P 6/08* (2013.01)

(58) Field of Classification Search
CPC .... H02P 7/29; H02P 6/08; H02P 23/14; H02P 21/16
USPC .......................................... 388/811; 318/599
See application file for complete search history.

(56) References Cited

U.S. PATENT DOCUMENTS

| | | | | |
|---|---|---|---|---|
| 2008/0088284 A1* | 4/2008 | Weng | .................. | H02M 3/1563 323/271 |
| 2010/0066283 A1* | 3/2010 | Kitanaka | ................. | B60L 50/51 318/400.02 |
| 2011/0109290 A1* | 5/2011 | Tang | ..................... | H02M 3/156 323/282 |
| 2012/0154001 A1* | 6/2012 | Seo | ....................... | H03L 7/0818 327/158 |
| 2015/0097603 A1* | 4/2015 | Amirkhany | .......... | H03K 5/1565 327/155 |
| 2015/0214932 A1* | 7/2015 | Tomita | ................. | H03K 5/1565 327/156 |

FOREIGN PATENT DOCUMENTS

JP         2001-102925 A        4/2001

* cited by examiner

*Primary Examiner* — Jorge L Carrasquillo
(74) *Attorney, Agent, or Firm* — Keating & Bennett

(57) ABSTRACT

A signal processing apparatus includes a processor, a memory storing a program, and an integration circuit that performs filter processing on an input signal to output a processed signal. The processor samples an output signal output from the integration circuit in a sampling period Ts and stores a sampled value of the output signal in accordance with the program, and detects a duty of the input signal based on a difference between a value of the output signal at a time $t_0$ representing a present time point and a sampled value of the output signal obtained at a time $t_0-n$ representing an earlier time than the time $t_0$ by an n sampling period when n is a positive integer, the value of the output signal, a value of the integer n, the sampling period Ts, and a time constant of a filter of the integration circuit.

13 Claims, 4 Drawing Sheets

SIGNAL PROCESSING APPARATUS, MOTOR, AND FAN MOTOR

CROSS REFERENCE TO RELATED APPLICATION

The present application claims priority under 35 U.S.C. § 119 to Japanese Application No. 2018-221078 filed on Nov. 27, 2018, the entire contents of which are hereby incorporated herein by reference.

1. Field of the Invention

The present disclosure relates to a signal processing apparatus, a motor, and a fan motor.

2. Background

A digital-to-analog conversion apparatus including a low-pass filter circuit that converts a pulse width modulation (PWM) signal into an analog output signal has been proposed. A digital-to-analog apparatus in the related art includes a PWM circuit that generates a PWM signal, an output buffer circuit, and a low-pass filter circuit. The digital-to-analog conversion apparatus improves an accuracy error of an analog output signal, which may be generated by receiving influence from an output impedance of the output buffer circuit, by adjusting a duty of the PWM signal, and outputs a desired analog output signal.

SUMMARY

According to an example embodiment of the present disclosure, a signal processing apparatus includes a processor, a memory that stores a program that controls operation of the processor, and an integration circuit to perform filter processing on an input signal and output a processed signal. The processor samples an output signal output from the integration circuit in response to the input signal in a predetermined sampling period Ts and stores a sampled value of the output signal in the memory in accordance with the program stored in the memory. When n is a positive integer, the processor detects a duty D of the input signal based on a difference between a value of the output signal output from the integration circuit at a time $t_0$ representing a present time point and a sampled value of the output signal which is obtained at a time $t_0-n$ representing an earlier time than the time $t_0$ by an n sampling period, the value of the output signal from the integration circuit, a value of the integer n, the sampling period Ts, and a time constant $\tau$ of a filter of the integration circuit.

The above and other elements, features, steps, characteristics and advantages of the present disclosure will become more apparent from the following detailed description of the example embodiments with reference to the attached drawings.

DETAILED DESCRIPTION

Figure 1:
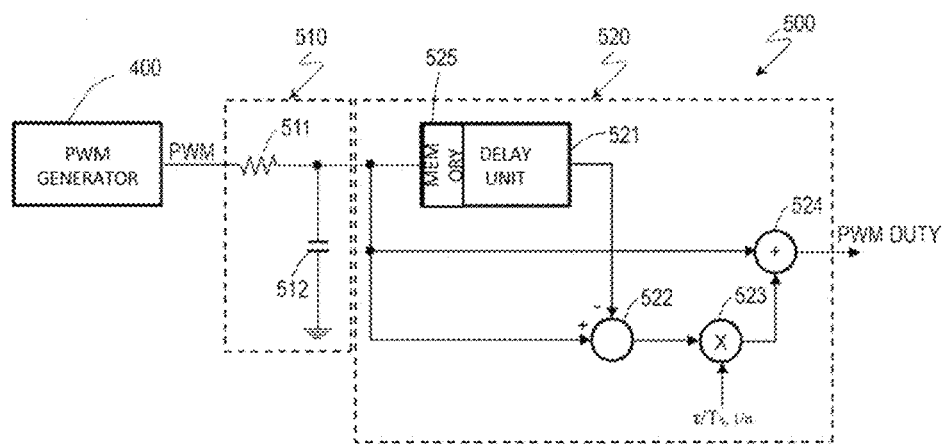
FIG. 1 is a schematic diagram illustrating a block configuration of a signal processing apparatus according to an example embodiment and particularly illustrating a functional block of differential operation circuitry.

When an input signal waveform is supplied to a low-pass filter circuit (may be referred to as "LPF" in some cases) having a time constant, an output signal waveform is rounded due to action of a first order lag. Therefore, when change in the output signal waveform is detected at the output side of the LPF, a lag resulting from a time constant occurs between a timing at which the input signal waveform at the input side changes and a timing at which the change in the output signal waveform is detected at the output side. Thus, it becomes difficult at the output side to detect the timing of the signal change that has occurred at the input side. The lag in the detection may affect operation of a device or an apparatus in some cases.

For example, when a LPF having a small time constant is used, rounding of the output signal waveform is reduced. However, a lower limit of an allowable range of a frequency of an input signal is raised. In other words, only a signal having a high frequency can be dealt with. As a result, freedom of a product specification is decreased. As an alternative to the above-described configuration, the rounding of the output signal waveform can also be reduced by connecting a plurality of LPFs having different time constants in parallel with each other. However, in this case, a port is required in a circuit chip at a reception side or the like. Furthermore, since the number of components is increased, a mounting area and costs may increase.

Low-pass filter processing for converting a digital signal into an analog signal is integral operation processing. As a result of study by the present inventor, it is found that a signal waveform processed by a LPF having a small time constant can be accurately restored when a signal waveform processed by a LPF having a large time constant is processed by software (or firmware) using a simple algorithm including a differential operation. According to a signal processing apparatus of the present disclosure, a value of an input signal and a timing of signal change generated at the input side can be immediately and accurately detected at the output side.

According to a non-restrictive and example embodiment, a signal processing apparatus of the present disclosure includes a processor, a memory that stores a program that controls operation of the processor, and an integration circuit to perform filter processing on an input signal and output a processed signal. The processor executes the following processing in accordance with the program stored in the memory.

(1) The processor samples, in a predetermined sampling period Ts, an output signal output from the integration circuit in response to the input signal and stores a sampled value of the output signal in the memory.

(2) The processor detects a duty D of the input signal based on a difference between a value of the output signal output from the integration circuit at a time $t_0$ representing a present time point and a sampled value of the output signal which is obtained at a time $t_0-n$ (n is a positive integer) representing an earlier time than the time $t_0$ by an n sampling period, the value of the output signal from the integration circuit, a value of the integer n, the sampling period Ts, and a time constant $\tau$ of a filter of the integration circuit.

The processor may be, for example, a central processing unit (CPU) or an integrated circuit (IC) chip such as a digital-signal-processing processor. In the present specification, the "processor" is widely interpreted as a term including an IC chip such as a field programmable gate array (FPGA) in which the processor is incorporated.

A memory is a recording medium that stores a computer program that controls the operation of the processor. The memory is also a recording medium that temporarily stores results of operations sequentially performed by the processor. In the present specification, a term "memory" includes a data memory and a program memory. The memory is not necessarily a single recording medium and may be an assembly of a plurality of recording media. The memory may include, for example, a volatile semiconductor memory such as a random access memory (RAM), a non-volatile semiconductor memory such as a flash read only memory (ROM), and a storage device such as a hard disc drive. At least part of the memory may be a detachable recording medium.

The integration circuit is a low-pass filter circuit including a resistor-capacitor (RC) filter circuit. A time constant of the RC filter is denoted by τ. The integration circuit according to the present disclosure mainly functions as an analog-to-digital conversion circuit and further has a function of removing noise included in the input signal or a function of delaying the input signal. A specific configuration of the integration circuit according to the present disclosure is not restrictive as long as the above-mentioned functions are included.

The input signal may be a digital signal or an analog signal. A typical example of the digital signal is a PWM signal. In addition to this, for example, the digital signal may also be a pulse frequency modulation (PFM) signal, a pulse-density modulation (PDM) signal, a pulse-position modulation (PPM) signal, or the like. The analog signal is, for example, a pulse amplitude modulation (PAM) signal. The present specification mainly deals with the input signal as the PWM signal that is the digital signal.

The signal processing apparatus according to the present disclosure may be widely installed in an electronic device to detect a duty of the input signal. For example, the signal processing apparatus may preferably be installed in a brushless DC motor such as a fan motor.

Hereinafter, example embodiments of the signal processing apparatus according to the present disclosure, and a motor or a fan motor including the signal processing apparatus will be described with reference to the accompanying drawings. Note that unnecessarily detailed description may be omitted in some cases. For example, detailed description on items already widely recognized and redundant description on substantially the same configurations may be omitted in some cases. This is to facilitate understanding by the skilled in the art while the following description does not unnecessarily become redundant. The present inventor et al., provide the accompanying drawings and the following description for the skilled in the art to sufficiently understand the present disclosure. These accompanying drawings and description are not intended to restrict the gist described in the scope of claims. In the following description, the same or similar components are assigned with the same reference signs.

Figure 2:
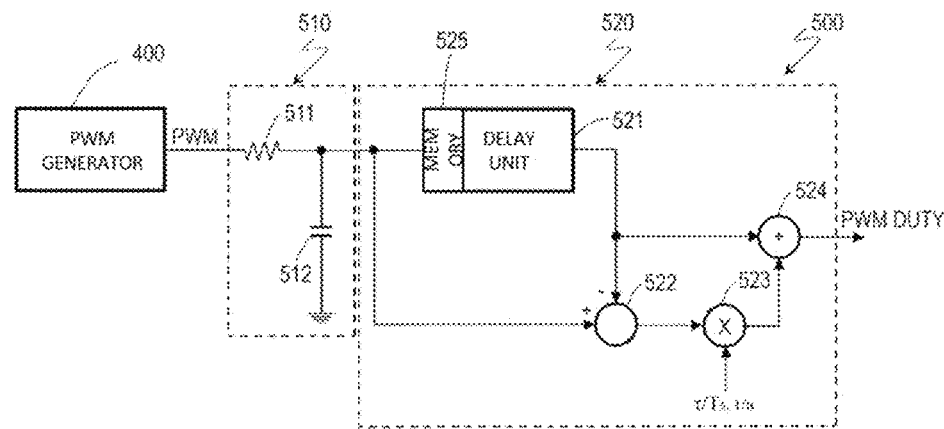
FIG. 2 is a schematic diagram illustrating a variation of the functional block of the differential operation circuitry.
Figure 3:
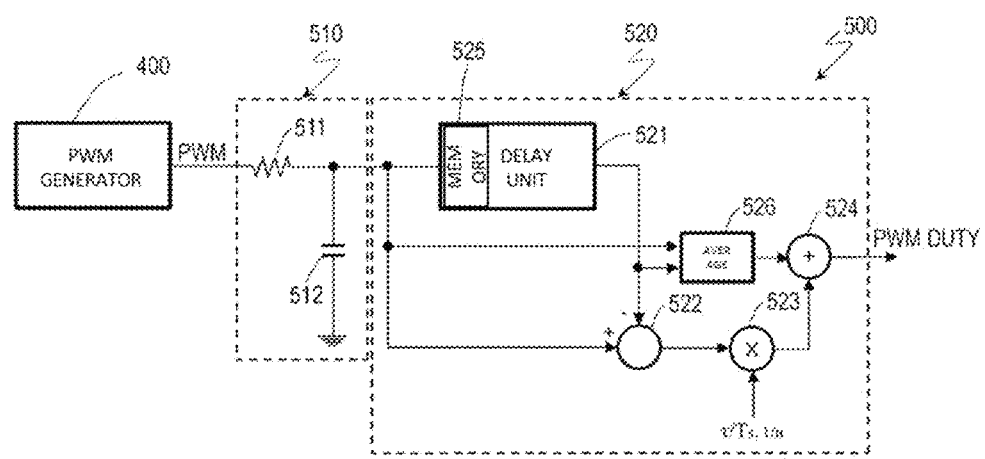
FIG. 3 is a schematic diagram illustrating a variation of the functional block of the differential operation circuitry.

FIG. 1 is a schematic diagram illustrating a block configuration of a signal processing apparatus 500 according to the present example embodiment, and particularly illustrating a functional block of differential operation circuitry 520. FIGS. 2 and 3 are schematic diagrams illustrating variations of the functional block of the differential operation circuitry 520. Respective blocks in the differential operation circuitry 520 are illustrated in units of functional blocks instead of units of hardware.

The signal processing apparatus 500 is an apparatus that performs signal processing on a PWM signal output from a PWM generator 400 and detects a duty D of the PWM signal. The PWM generator 400 generates the PWM signal based on a particular duty ratio and a frequency of an oscillating pulse. The PWM generator 400 is installed in a device in which the signal processing apparatus 500 is also installed or in an external device that is different from a device in which the signal processing apparatus 500 is installed. A typical example including the signal processing apparatus 500 is a device that uses the PWM signal for motor rotation control, such as, for example, a fan motor. In such a mode, the PWM generator 400 may be installed on a user system side where the fan motor is controlled. In a case where the fan motor is installed in a main body of a server or a desktop personal computer, the user system may be an entirety or part of a system constituted by various electronic components mounted to a mother board.

The signal processing apparatus 500 includes an integration circuit 510 to perform filter processing on the PWM signal output by the PWM generator 400 and the differential operation circuitry 520 configured to detect the duty D of the PWM signal.

The integration circuit 510 converts the PWM signal into an analog signal and outputs a voltage signal at a voltage level in accordance with the duty D of the PWM signal. The integration circuit 510 includes an RC filter circuit including a resistor 511 and a capacitor 512 and having a time constant τ. For example, a resistance value of the resistor 511 is approximately 100 kΩ, and a capacitance of the capacitor 512 is approximately 2 µF. An appropriate value of the time constant τ is determined based on a period of the PWM signal. The period of the PWM signal is generally within a range of several µs to several ms. For example, the time constant τ is set at approximately 100 ms. For example, in a case where the signal processing apparatus 500 is built in the motor, the time constant τ of the filter is preferably 100 times or more the period of the PWM signal. With this configuration, noise included in the PWM signal can be efficiently removed, and as a result, it becomes possible to immediately detect the change in the duty D of the PWM signal.

The differential operation circuitry 520 includes a delay unit 521, a subtractor 522, a multiplier 523, and an adder 524. The differential operation circuitry 520 detects the duty D of the PWM signal based on the output signal from the integration circuit 510. Specifically, when the processor sequentially executes computer programs that prescribe respective arithmetic operation processes of the delay unit 521, the subtractor 522, the multiplier 523, and the adder 524, the duty D of the PWM signal is detected.

First, a signal used for signal processing for detecting the duty D is defined. A present time point is represented by a time $t_0$, and an earlier time than the time $t_0$ by n sampling periods is represented by a time $t_0-n$. Herein, n is a positive integer. A sampling period is a sampling period of the delay unit 521 and is denoted by Ts. A value of the output signal output from the integration circuit 510 at the time $t_0$ is denoted by $s(t_0)$. A value of the output signal output from the integration circuit 510 at the time $t_0-n$ is denoted by $s(t_0-n)$. A ratio of the time constant τ of the filter to the sampling period Ts is denoted by τ/Ts.

The processor detects the duty D of the PWM signal by adding a value obtained by multiplying a difference between the signal $s(t_0)$ and the signal $s(t_0-n)$ by the ratio $\tau/Ts$ and $1/n$, to the value of the output signal from the integration circuit 510. The processor can obtain the duty D of the PWM signal based on various operational expressions.

According to an example embodiment, the processor detects the duty D of the PWM signal by performing the operation of Expression 1. FIG. 1 illustrates a configuration example of a functional block of the differential operation circuitry 520 for realizing the operation processing of Expression 1. When the operation of Expression 1 is performed, it becomes possible to improve following property of a directive value with which the duty of the PWM signal (original input signal) is restored.

$$D=s(t_0)+(1/n)\{s(t_0)-s(t_0-n)\}(\tau/Ts) \tag{1}$$

According to an example embodiment, the processor detects the duty D of the PWM signal by performing the operation of Expression 2. FIG. 2 illustrates a configuration example of the functional block of the differential operation circuitry 520 for realizing the operation processing of Expression 2. When the operation of Expression 2 is performed, it becomes possible to reduce overshoot that may occur in the directive value with which the duty of the original input signal is restored.

$$D=s(t_0-n)+(1/n)\{s(t_0)-s(t_0-n)\}(\tau/Ts) \tag{2}$$

According to an example embodiment, the processor detects the duty D of the PWM signal by performing the operation of Expression 3. FIG. 3 illustrates a configuration example of the functional block of the differential operation circuitry 520 for realizing the operation processing of Expression 3. When the operation of Expression 3 is performed, it becomes possible to reduce not only the overshoot but also undershoot that may occur in the directive value with which the duty of the original input signal is restored.

$$D=\{s(t_0)+s(t_0-n)\}/2+(1/n)\{s(t_0)-s(t_0-n)\}(\tau/Ts) \tag{3}$$

It should be noted that Expressions 1 to 3 described above are merely examples of the arithmetic operations usable for detecting the duty D of the PWM signal. Needless to say, the processor may also detect the duty D of the PWM signal by performing arithmetic operations with which results equivalent to the results obtained through these numeric expressions are obtained.

With reference to FIG. 1, specific processing will be described in more detail for each block of the delay unit 521, the subtractor 522, the multiplier 523, or the adder 524 included in the differential operation circuitry 520. Hereinafter, to be more understandable, description is given as if each block itself performs the computer program. It is noted however that the processor actually performs processing.

The delay unit 521 samples, in the predetermined sampling period Ts, the output signal output from the integration circuit 510 in response to the PWM signal output by the PWM generator 400 and stores a sampled value of the output signal in a data memory 525. In more detail, the sampling period Ts is a period for the processor to take in the output signal output from the integration circuit 510 as the sampled value. Ts is set as a value sufficiently shorter than a period in which the value of the duty D does not change, that is, is constant. Ts is set to, for example, a value in a range of 20 ms to 0.5 s. Ts is preferably ⅕ or smaller than the time constant $\tau$ of the filter. With this configuration, for example, noise included in the PWM signal can be efficiently removed, and as a result, it becomes possible to highly accurately detect the duty D of the PWM signal.

It is sufficient when the data memory 525 has a memory size with which at least sampled values of n output signals for the n sampling periods can be stored. The delay unit 521 continues obtaining a sampled value of the output signal in the sampling period Ts during the PWM signal being input to the integration circuit 510. Thus, each of the n sampled values stored in the data memory 525 may be updated in every n sampling periods (n*Ts).

In the present specification, as a specific example, a method for detecting the duty D in the case where the value of the integer n is 1 will be described in detail. The data memory 525 holds at least the sampled value of the output signal obtained at a time t−1 corresponding to a time before the present time point by one sampling period. The sampled value is equivalent to the value $s(t_0-1)$ of the output signal output from the integration circuit 510 at the time $t_0-1$. The sampled value is represented by $s(t_0-1)$ similarly as that value of the output signal.

The subtractor 522 reads the sampled value $s(t_0-1)$ from the data memory 525. The subtractor 522 obtains a difference $\{s(t_0)-s(t_0-n)\}$ between the value $s(t_0)$ of the output signal at the time $t_0$ output from the integration circuit 510 and the read sampled value $s(t_0-1)$.

The multiplier 523 multiplies the difference $\{s(t_0)-s(t_0-n)\}$ by the ratio $\tau/Ts$ and $1/n$ and outputs $(1/n)\{s(t_0)-s(t_0-n)\}(\tau/Ts)$. In the case of n=1, the output is $\{s(t_0)-s(t_0-1)\}(\tau/Ts)$.

The adder 524 adds the output $\{s(t_0)-s(t_0-1)\}(\tau/Ts)$ from the multiplier 523 to the value $s(t_0)$ of the output signal at the time $t_0$ output from the integration circuit 510. Finally, the duty D of the PWM signal expressed by Expression 1 is obtained. When the duty D is calculated for each sampling period, the original PWM signal corresponding to the directive value of the duty is restored. That is, the detection of the duty D is equivalent to the restoration of the directive value of the duty of the original PWM signal. In this sense, the differential operation circuitry 520 detects the duty D and also generates a restored waveform of the directive value of the duty.

As illustrated in FIG. 2, the adder 524 may add the output $\{s(t_0)-s(t_0-1)\}(\tau/Ts)$ from the multiplier 523 to the sampled value $s(t_0-1)$ of the output signal obtained at the time t−1. As an alternative to the above-described configuration, as illustrated in FIG. 3, the differential operation circuitry 520 may further include an average block 526 configured to output an average value of the sampled value $s(t_0-n)$ and the value $s(t_0)$ of the output signal. In this case, the adder 524 adds the output $\{s(t_0)-s(t_0-1)\}(\tau/Ts)$ from the multiplier 523 to the output $\{s(t_0)+s(t_0-1)\}/2$ of the average block 526. Finally, the duty D of the PWM signal expressed by Expression 2 or Expression 3 is obtained.

The inventor verifies validity of an algorithm according to the present disclosure for detecting the duty D of the PWM signal. Various parameters used for the verification are as follows: the period (20 kHz) of the PWM signal, the sampling period Ts (20 ms) of the delay unit, a resistance value R (100 kΩ) of the resistor 511 included in the integration circuit 510, a capacitance C (1 μF) of the capacitor 512 included in the integration circuit 510, and the time constant $\tau(=CR=0.1$ s).

Figure 4:
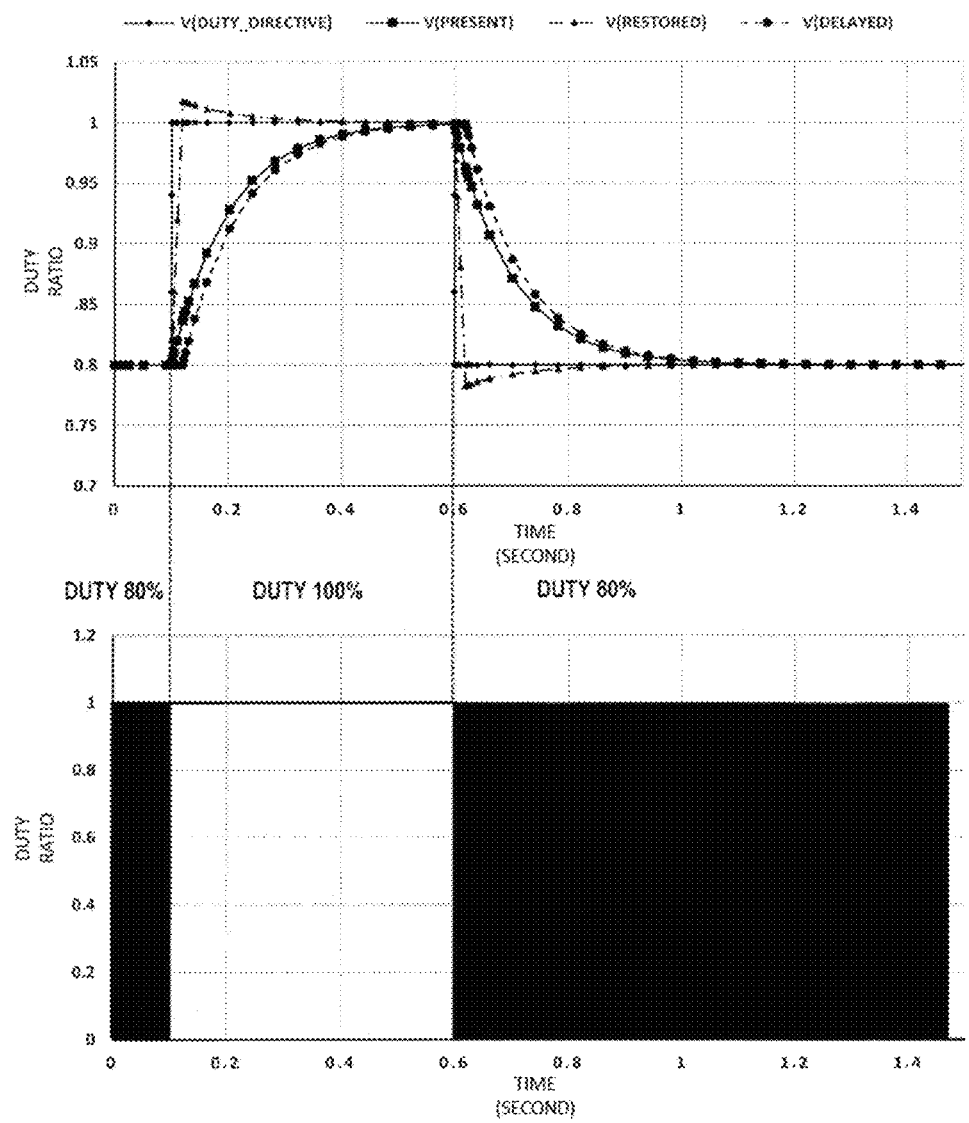
FIG. 4 is a graphic representation indicating a simulation result in which a duty directive value is restored.

FIG. 4 is a graphic representation indicating a simulation result in which the directive value of the duty is restored. A horizontal axis represents time (second: s is the unit), and a vertical axis represents a duty ratio. The duty ratio means a normalized voltage obtained by normalizing, using a voltage value at the duty ratio of 100%, a voltage value of the analog output signal output from the integration circuit 510.

In a graphic representation representing a verification result on a top side in FIG. 4, the voltage value S(t) of the analog output signal output from the integration circuit 510 is plotted by "■", the sampled value s(t−1) obtained by the delay unit 521 in the preceding period by one sampling period is plotted by "●", the directive value of the duty is plotted by "♦", and the restored value of the directive value of the duty is plotted by "▲". A graphic representation on a bottom side in FIG. 4 represents a waveform of the directive value of the duty. The directive value changes from 80% to 100% 0.1 s after the simulation is started and returns from 100% to 80% 0.6 s after the simulation is started. In this example, the duty D does not change for 0.5 s and is constant (100%).

When the algorithm according to the present disclosure is used, it is understood that the directive value of the duty of the PWM signal is sufficiently restored at the output side. At the time (0.1 s and 0.6 s) when the directive value of the duty changes, the change in the restored directive value can be immediately detected. The term "immediately" indicates that the change can be detected within a delay time equivalent to a time at least several times the n sampling period Ts. From this viewpoint, n is preferably set as a value as low as possible, and is more preferably set as 1. With this configuration, the directive value of the duty can be accurately restored. It is noted however that, as compared with a case where n is set as 1, when n is set as 2 or higher, it becomes possible to further reduce the operation burden on the processor.

For example, a threshold to be used for detecting rise of a signal is set as 95%, and signal change of rising from 80% to 100% is detected. In this case, after one sampling period elapses since the directive value of the duty is changed at the time 0.1 s at the input side, the change of the rise of the PWM signal can be detected at the output side. In addition, a threshold to be used for detecting fall of the signal is set as 85%, and signal change of falling from 100% to 80% is detected. In this case, after one sampling period elapses since the directive value of the duty is changed at the time 0.6 s at the input side, the change of the fall of the PWM signal can be detected at the output side.

In the electronic device that uses the PWM signal for the control, a specification may be requested for switching an operation mode in response to continuous detection of the input signal with the duty D within a given range for a predetermined period. For example, a range of 90% to 100% is requested as the given range, and a time of approximately 0.5 s to approximately 2.0 s is requested as the predetermined period. This is equivalent to detecting the directive value of the duty for 0.5 seconds from 0.1 s to 0.6 s illustrated in FIG. 4.

As illustrated in the verification results, in the waveform of the voltage value S(t) of the analog output signal output from the integration circuit 510, the time in which the duty is held to be higher than or equal to the threshold becomes 0.38 s, which is shorter than 0.5 s of the actual directive value. In contrast to this, when the detection of the duty D is performed based on the algorithm according to the present disclosure, the time in which the duty is held to be higher than or equal to the threshold becomes 0.49 s and is improved to be close to 0.5 s of the directive value. In this manner, the time for the signal change from the rise until the fall can be accurately measured, and it is possible to provide the signal processing apparatus that satisfies the above-mentioned specification requested.

A typical example of an electronic device in which the signal processing apparatus according to the present disclosure can be installed is a brushless DC motor such as a fan motor that operates based on the PWM signal supplied from an external apparatus. It is noted however that the electronic device is not restrictive to the brushless DC motor and may be an electrically-driven motor of any types. Any apparatus including a coil of a motor, a control circuit and peripheral circuit of the motor is collectively referred to as a "motor". Such apparatus may be referred to as a motor module in some cases. Hereinafter, configuration and operation of the electronic device in which the signal processing apparatus is installed will be described by using a brushless DC motor (fan motor) including an impeller as an example.

Figure 5:
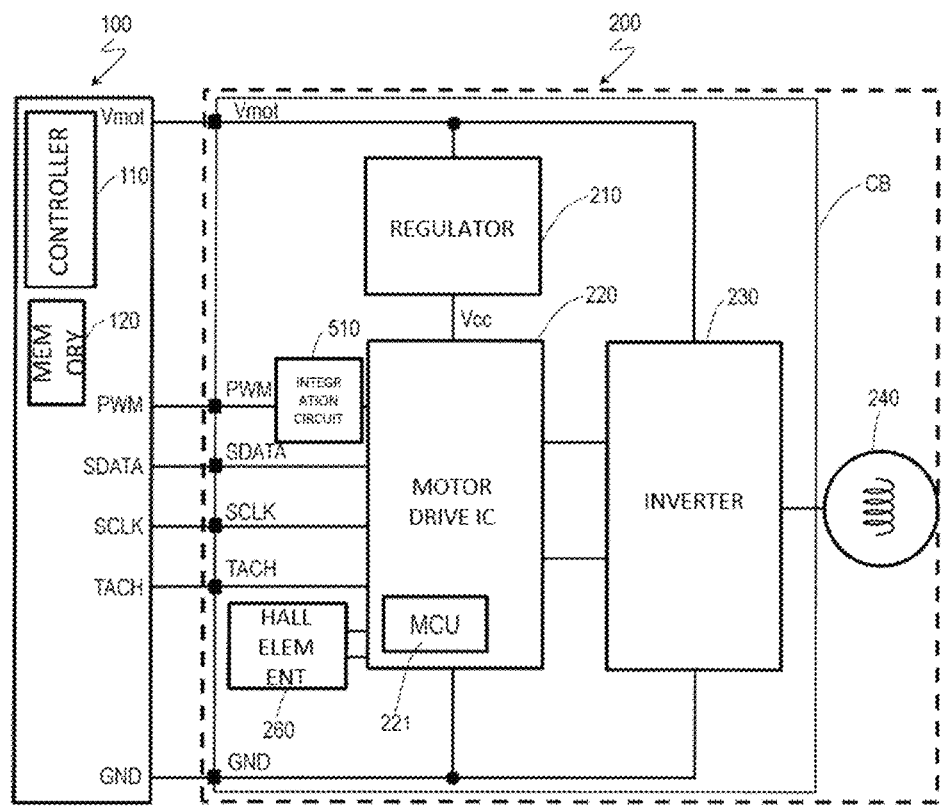
FIG. 5 is a schematic diagram illustrating a typical example of a block configuration of a user system and a brushless DC motor.

FIG. 5 is a schematic diagram illustrating a typical block configuration example of a user system 100 and a brushless DC motor 200. The brushless DC motor according to the present disclosure includes a motor of an inner rotor type or an outer rotor type. The brushless DC motor 200 is not limited to the fan motor and is a brushless DC motor usable for various purposes. The brushless DC motor 200 is, for example, a motor to be used for home electric appliances such as an air conditioner or a washing machine or an on-vehicle motor.

The user system 100 is electrically connected to the brushless DC motor 200. The user system 100 is able to control the brushless DC motor 200. The user system 100 may be a system in an electronic device or an on-vehicle system in which the brushless DC motor 200 can be installed. For example, the brushless DC motor 200 is preferably installed in a server or a main body of a desktop personal computer or an electronic device such as a gaming machine. In a case where the brushless DC motor 200 is installed in the server or the main body of the desktop personal computer, the user system 100 is an entirety or part of a system constituted by various electronic components mounted to the mother board.

The user system 100 includes, for example, a controller 110 and a memory 120.

The controller 110 can control the entirety of the user system 100 and the brushless DC motor 200. The controller 110 is, for example, a semiconductor integrated circuit such as a micro control unit (MCU) or a field programmable gate array (FPGA). The PWM generator 400 illustrated in FIG. 1 is installed in the controller 110, for example.

For example, the memory 120 is a writable memory (for example, PROM), a rewritable memory (for example, a flash memory), or a read only memory. The memory 120 stores control programs including an instruction group for the controller 110 to control the brushless DC motor 200. For example, those control programs are temporarily loaded onto a random access memory (RAM) (not illustrated) at the time of booting. It is noted that the memory 120 is not necessarily externally attached to the controller 110 and may be installed in the controller 110. The controller 110 in which the memory 120 is installed is, for example, the above-mentioned MCU.

The user system 100 includes, for example, a Vmot terminal, a PWM terminal, a TACH terminal, and a GND terminal as control terminals for the brushless DC motor 200. The user system 100 may also include an SDATA terminal, an SCLK terminal, a CW/CCW terminal that controls a rotation direction of the motor, a START/STOP terminal that instructs the motor to start or stop rotation, or the like as an option. In the present example embodiment, the rotation of the motor means rotation of the fan motor (or fan).

The Vmot terminal is a terminal for a motor power supply. For example, a power supply voltage of 52 V is supplied to the brushless DC motor 200 from the Vmot terminal via a power supply line.

The PWM terminal is an output terminal for controlling the number of rotations of the motor. The controller 110 (in more detail, a PWM generator) generates a PMW signal for controlling the rotation of the motor as a speed directive signal and outputs the signal to the brushless DC motor 200 via the PWM terminal.

The TACH terminal is an input terminal for a tachometer that monitors a rotation speed of the motor. The rotation speed is represented by revolutions per minute (rpm) at which the motor rotates per unit time (one minute) or revolutions per second (rps) at which the motor rotates per unit time (one second). For example, two pulses per rotation of the motor are output from the TACH terminal of the fan motor. A pulse signal output from the TACH terminal of the brushless DC motor 200 in accordance with the rotation speed of the motor is input to the TACH terminal of the user system 100.

The SDATA terminal and the SCLK terminal are input and output terminals that perform I²C communication. The SDATA terminal and the SCLK terminal are optional terminals and not necessarily included. It is possible to perform serial communication between the user system 100 and the brushless DC motor 200 via the SDATA terminal and the SCLK terminal.

The brushless DC motor 200 is a fan motor including a rotor, a stator, and an impeller. The brushless DC motor 200 is, for example, an axial flow fan, a centrifugal fan, a cross flow fan, or a Sirocco fan. The brushless DC motor 200 typically includes a regulator 210, a motor drive IC 220, an inverter 230, a circuit board CB to which those electronic components are mounted, a coil 240, a Hall element 260, and the integration circuit 510. For example, the regulator 210, the motor drive IC 220, the inverter 230, and the Hall element 260 constitute a motor driving circuit configured to drive the motor by passing current to the coil 240.

For example, the brushless DC motor 200 includes a circuit board CB where a Vmot terminal, a PWM terminal, an SDATA terminal, an SCLK terminal, a TACH terminal, and a GND terminal are arranged corresponding to the terminals on the user system 100 side. In the brushless DC motor 200, the PWM terminal is an input terminal, and the TACH terminal is an output terminal.

The regulator 210 lowers the voltage of the motor power supply at 52 V and generates a power supply voltage Vcc (for example, 5 V) for the motor drive IC 220, for example. It is noted however that the regulator 210 is not necessarily provided, and the power supply voltage Vcc may alternatively be supplied from the user system 100 to the brushless DC motor 200 separately from a motor power supply voltage Vmot.

The motor drive IC 220 is connected to the inverter 230. The motor drive IC 220 generates a control signal for controlling the inverter 230 in accordance with the PWM signal transmitted from the user system 100.

The integration circuit 510 is electrically connected between the PWM terminal and the motor drive IC 220. It is noted however that the integration circuit 510 may be installed in the motor drive IC 220. The integration circuit 510 includes an RC filter circuit having a time constant τ of approximately 0.1 s, for example.

The motor drive IC 220 includes a built-in MCU 221. Software (or firmware) including computer programs for prescribing processing of the differential operation circuitry 520 is preferably implemented in the MCU of the motor drive IC 220. The motor drive IC 220 detects the duty D of the PWM signal in response to the output signal output from the integration circuit 510.

The motor drive IC 220 includes the SDATA terminal and the SCLK terminal and can perform the I²C communication with the user system 100. As will be described below, the motor drive IC 220 switches the operation mode to a communication mode in a case where the PWM signal satisfies a predetermined condition.

The motor drive IC 220 monitors the rotation speed of the motor based on an output from the Hall element 260, for example, and generates a pulse signal in accordance with the rotation speed of the motor. In the output method, for example, two pulses are output per rotation. It is noted however that a technique for generating a TACH signal without using the Hall element has been known. In a case where such technique is used, the Hall element 260 is not used.

The inverter 230 is electrically connected to the motor drive IC 220 and the coil 240 of the motor. The inverter 230 converts power of the motor power supply into power to be supplied to the fan motor to energize the coil 240.

A chopping waveform of the PWM signal is converted into a signal waveform of an analog voltage by low-pass filter processing of the integration circuit 510. However, the signal waveform of the analog voltage is rounded due to the action of the first order lag of the RC filter circuit. Up to now, this rounding of the signal waveform particularly affecting the operation of the apparatus has not been seen as an issue.

A brushless DC motor which has, as operation modes, a communication mode for performing communication with an external device in addition to a normal mode for performing normal control on the motor rotation has been developed. The rounding of the signal waveform of the analog voltage may affect the operation of the brushless DC motor in some cases. The following case actually exists. A specification for switching the operation mode from the normal mode to the communication mode is requested in the brushless DC motor in response to the PWM signal with the duty D within the predetermined range being continuously detected for a predetermined period. Time management of the duty D of the PWM signal is required for the switching of the operation mode.

According to an example embodiment, both the user system 100 and the brushless DC motor 200 perform communication and obtain motor identification information. In the communication mode, the user system 100 and the brushless DC motor 200 transmit and receive commands via the power supply line Vmot, the PWM signal line, or the TACH signal line. The user system 100 obtains the motor identification information by handshake and determines agreement with the brushless DC motor 200. For example, the specification of US Patent Application Publication No. 2006/0152891 discloses such a communication technology.

For example, when the PWM signal with the duty D within the predetermined range is continuously detected for a predetermined period, the motor drive IC 220 switches the operation mode to the communication mode. The motor drive IC 220 switches the TACH signal to a communication signal in the communication mode and transmits manufacture information including, for example, a model name or date of manufacture of the motor via the TACH signal line to the user system 100 side.

According to the present example embodiment, as described with reference to the verification results exemplified in FIG. 4, the duty D and change of the PWM signal output from the user system 100 can be accurately and immediately detected, and it is possible to precisely measure the time in which the duty D is held within the predetermined range. With this configuration, transition to the communication mode can be appropriately performed, and as a result, the communication between the user system 100 and the brushless DC motor 200 is realized.

The brushless DC motor 200 can perform the motor control by using both the duty D of the PWM signal detected by the motor drive IC 220 and the analog output signal output from the integration circuit 510. For example, it becomes possible to perform a plurality of controls such as control on the rotation speed of the motor by using the analog output signal and the switching of the above-mentioned operation mode based on the detection result of the duty D of the PWM signal.

The input signal input to the signal processing apparatus according to the present disclosure is not limited to the PWM signal, and an analog signal such as a frequency locked loop (FLL), a phase locked loop (PLL), a frequency modulation (FM), an amplitude modulation (AM), a phase modulation (PM), or a phase shift keying (PSK) signal may also be used. The integration circuit 510 is mainly used for removing noise included in the input signal. Needless to say, the waveform of the signal output from the integration circuit 510 is rounded due to the action of the first order lag. When the algorithm according to the present disclosure is applied to the input signal other than the PWM signal, the directive value of the original input signal can be accurately restored at the output side of the integration circuit 510 similarly as in the PWM signal. As a result, it becomes possible to improve the following property of the restoration of the directive value of the original input signal. In this manner, the signal processing apparatus according to the present disclosure is also useful as an apparatus that processes an analog signal.

The example embodiment of the present disclosure is widely applicable to a wide range of devices including various fan motors such as, for example, a personal computer, a gaming machine, a vacuum cleaner, a dryer, a washing machine, or a refrigerator.

Features of the above-described preferred example embodiments and the modifications thereof may be combined appropriately as long as no conflict arises.

While example embodiments of the present disclosure have been described above, it is to be understood that variations and modifications will be apparent to those skilled in the art without departing from the scope and spirit of the present disclosure. The scope of the present disclosure, therefore, is to be determined solely by the following claims.

What is claimed is:

1. A signal processing apparatus comprising:
a processor;
a memory that stores a program that controls operation of the processor; and
an integration circuit to perform filter processing on an input signal and output a output signal; wherein
in accordance with the program stored in the memory, the processor:
samples the output signal output from the integration circuit in response to the input signal in a predetermined sampling period Ts and stores a sampled value of the output signal in the memory; and
detects a duty D of the input signal based on:
a difference between a value of the output signal output from the integration circuit at a time $t_0$ representing a present time point and a sampled value of the output signal which is obtained at a time $t_0-n$ representing an earlier time than the time $t_0$ by an n sampling period when n is a positive integer;
the value of the output signal from the integration circuit;
a value of the integer n;
the sampling period Ts; and
a time constant $\tau$ of a filter of the integration circuit; and
the processor detects the duty D of the input signal by adding a value obtained by multiplying the difference by a ratio $\tau/Ts$ of the time constant $\tau$ of the filter to the sampling period Ts and $1/n$, to the value of the output signal from the integration circuit.

2. The signal processing apparatus according to claim 1, wherein the processor detects the duty D of the input signal by calculating:

$$D=s(t_0)+(1/n)\{s(t_0)-s(t_0-n)\}(\tau/Ts),$$

where $s(t_0)$ denotes the value of the output signal output from the integration circuit at the time $t_0$, and $s(t_0-n)$ denotes the sampled value of the output signal obtained at the time $t_0-n$.

3. The signal processing apparatus according to claim 1, wherein the processor detects the duty D of the input signal by calculating:

$$D=s(t_0-n)+(1/n)\{s(t_0)-s(t_0-n)\}(\tau/Ts),$$

where $s(t_0)$ denotes the value of the output signal output from the integration circuit at the time $t_0$, and $s(t_0-n)$ denotes the sampled value of the output signal obtained at the time $t_0-n$.

4. The signal processing apparatus according to claim 1, wherein the processor detects the duty D of the input signal by calculating:

$$D=\{s(t_0)+s(t_0-n)\}/2+(1/n)\{s(t_0)-s(t_0-n)\}(\tau/Ts),$$

where $s(t_0)$ denotes the value of the output signal output from the integration circuit at the time $t_0$, and $s(t_0-n)$ denotes the sampled value of the output signal at the time $t_0-n$.

5. The signal processing apparatus according to claim 1, wherein the sampling period Ts is about ⅕ or smaller the time constant $\tau$ of the filter.

6. The signal processing apparatus according to claim 1, wherein the input signal is a pulse width modulation signal.

7. The signal processing apparatus according to claim 6, wherein the time constant $\tau$ of the filter is determined based on a period of the pulse width modulation signal.

8. The signal processing apparatus according to claim 7, wherein the time constant $\tau$ of the filter is 100 times or larger the period of the pulse width modulation signal.

9. The signal processing apparatus according to claim 1, wherein the value of the integer n is 1.

10. A motor comprising:
the signal processing apparatus according to claim 1;
a stator; and
a rotor.

11. The motor according to claim 10, wherein
the motor includes an operation mode that can be switched to a communication mode used in communicating with an external device; and
the operation mode is switched to the communication mode in response to continuous detection of the input signal with the duty D within a range for a predetermined period.

12. The motor according to claim 10, wherein motor control is performed by using the duty D of the input signal detected by the signal processing apparatus and the output signal output from the integration circuit.

13. A fan motor comprising:
an impeller;
a motor; and
the signal processing apparatus according to claim 1.

* * * * *